US010460905B2

(12) United States Patent
McCord et al.

(10) Patent No.: US 10,460,905 B2
(45) Date of Patent: Oct. 29, 2019

(54) BACKSCATTERED ELECTRONS (BSE) IMAGING USING MULTI-BEAM TOOLS

(71) Applicant: KLA-Tencor Corporation, Milpitas, CA (US)

(72) Inventors: Mark A. McCord, Los Gatos, CA (US); Richard R. Simmons, Los Altos, CA (US); Doug K. Masnaghetti, San Jose, CA (US); Rainer Knippelmeyer, Groton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 73 days.

(21) Appl. No.: 15/245,765

(22) Filed: Aug. 24, 2016

(65) Prior Publication Data

US 2017/0084421 A1 Mar. 23, 2017

Related U.S. Application Data

(60) Provisional application No. 62/222,351, filed on Sep. 23, 2015.

(51) Int. Cl.
*H01J 37/244* (2006.01)
*H01J 37/04* (2006.01)
(Continued)

(52) U.S. Cl.
CPC .......... *H01J 37/244* (2013.01); *H01J 37/045* (2013.01); *H01J 37/28* (2013.01); *H01J 37/3177* (2013.01);
(Continued)

(58) Field of Classification Search
CPC ....... H01J 2237/0435; H01J 2237/0453; H01J 2237/15; H01J 2237/2448; H01J 2237/31774; H01J 37/04; H01J 37/045; H01J 37/244; H01J 37/3177; H01J 2237/24475; H01J 37/28; H01J 2237/057;
(Continued)

(56) References Cited

U.S. PATENT DOCUMENTS 7,186,975 B2 * 3/2007 Ishitani .................. H01J 37/09
250/307
7,244,949 B2 7/2007 Knippelmeyer et al.
(Continued)

FOREIGN PATENT DOCUMENTS

JP 2015038892 A 2/2015

OTHER PUBLICATIONS

PCT International Search Report for International Application No. PCT/US2016/052766 dated Jan. 5, 2017, 3 pages.

*Primary Examiner* — Wyatt A Stoffa
(74) *Attorney, Agent, or Firm* — Suiter Swantz pc llo

(57) ABSTRACT

Multi-beam scanning electron microscope inspection systems are disclosed. A multi-beam scanning electron microscope inspection system may include an electron source and a beamlet control mechanism. The beamlet control mechanism may be configured to produce a plurality of beamlets utilizing electrons provided by the electron source and deliver one of the plurality of beamlets toward a target at a time instance. The multi-beam scanning electron microscope inspection system may also include a detector configured to produce an image of the target at least partially based on electrons backscattered out of the target.

22 Claims, 6 Drawing Sheets

(51) Int. Cl.
*H01J 37/28* (2006.01)
*H01J 37/317* (2006.01)

(52) U.S. Cl.
CPC . *H01J 2237/0435* (2013.01); *H01J 2237/057* (2013.01); *H01J 2237/221* (2013.01); *H01J 2237/226* (2013.01); *H01J 2237/2448* (2013.01); *H01J 2237/24475* (2013.01); *H01J 2237/2805* (2013.01)

(58) Field of Classification Search
CPC .......... H01J 2237/221; H01J 2237/226; H01J 2237/2805
See application file for complete search history.

(56) References Cited

U.S. PATENT DOCUMENTS

| | | | |
|---|---|---|---|
| 7,276,694 B1 * | 10/2007 | Bertsche | H01J 37/244 250/305 |
| 7,504,622 B2 | 3/2009 | Elyasaf et al. | |
| 7,554,094 B2 | 6/2009 | Knippelmeyer et al. | |
| 8,039,813 B2 | 10/2011 | Casares et al. | |
| 8,097,847 B2 | 1/2012 | Knippelmeyer et al. | |
| 8,637,834 B2 | 1/2014 | Knippelmeyer et al. | |
| 9,224,576 B2 | 12/2015 | Knippelmeyer et al. | |
| 9,324,537 B2 | 4/2016 | Kemen et al. | |
| 9,336,981 B2 | 5/2016 | Knippelmeyer | |
| 9,384,938 B2 | 7/2016 | Zeidler et al. | |
| 2002/0079448 A1 * | 6/2002 | Ishitani | H01J 37/09 250/310 |
| 2009/0114818 A1 | 5/2009 | Casares et al. | |
| 2009/0200463 A1 * | 8/2009 | Degenhardt | H01J 37/244 250/307 |
| 2009/0256075 A1 * | 10/2009 | Kemen | H01J 37/045 250/307 |
| 2012/0241606 A1 | 9/2012 | Han et al. | |
| 2013/0032729 A1 | 2/2013 | Knippelmeyer | |
| 2013/0099114 A1 | 4/2013 | Kooijman et al. | |
| 2013/0187046 A1 | 7/2013 | Zeidler et al. | |
| 2014/0042334 A1 | 2/2014 | Wieland | |
| 2014/0158902 A1 | 6/2014 | Knippelmeyer et al. | |
| 2014/0197322 A1 | 7/2014 | Eder et al. | |
| 2015/0008331 A1 * | 1/2015 | Kemen | H01J 37/045 250/396 R |
| 2015/0155134 A1 * | 6/2015 | Frosien | H01J 37/05 250/310 |
| 2015/0179399 A1 | 6/2015 | Kruit et al. | |
| 2015/0270095 A1 | 9/2015 | Kruit | |
| 2016/0372304 A1 | 12/2016 | Masnaghetti et al. | |

* cited by examiner

BACKSCATTERED ELECTRONS (BSE) IMAGING USING MULTI-BEAM TOOLS

CROSS-REFERENCE TO RELATED APPLICATIONS

The present application claims the benefit under 35 U.S.C. § 119(e) of U.S. Provisional Application Ser. No. 62/222,351, filed Sep. 23, 2015. Said U.S. Provisional Application Ser. No. 62/222,351 is hereby incorporated by reference in its entirety.

This application is related to concurrently filed U.S. Patent Application No. 62/221,593, having KLA Tencor Corporation and entitled "Multi-Beam Dark Field Imaging" listing Douglas Masnaghetti, et al. as inventors, the entirety of which is incorporated herein by reference.

TECHNICAL FIELD

The disclosure generally relates to the field of inspection systems, and particularly to electron beam inspection systems.

BACKGROUND

Thin polished plates such as silicon wafers and the like are a very important part of modern technology. A wafer, for instance, may refer to a thin slice of semiconductor material used in the fabrication of integrated circuits and other devices. Wafers are subject to defect inspections, and scanning electron microscope (SEM) inspection is considered one of the most sensitive forms of defect inspection for wafers.

A scanning electron microscope (SEM) is a type of electron microscope that produces images of a target (e.g., a wafer) by scanning it with a focused beam of electrons. The electrons interact with atoms in the target, producing various signals that contain information about the surface topography and composition of the target. It is noted that the throughput of a SEM may be increased by increasing the number of focused beams of electrons (providing a SEM known as a multi-beam SEM). It is also noted, however, that utilizing multiple focused beams of electrons complicates backscattered electrons (BSE) imaging. As a result, BSE imaging is not supported by currently available multi-beam SEMs.

SUMMARY

The present disclosure is directed to an apparatus. The apparatus may include an electron source and a beamlet control mechanism. The beamlet control mechanism may be configured to produce a plurality of beamlets utilizing electrons provided by the electron source and deliver one of the plurality of beamlets toward a target at a time instance. The apparatus may also include a detector configured to produce an image of the target at least partially based on electrons backscattered out of the target.

A further embodiment of the present disclosure is directed to an apparatus. The apparatus may include an electron source and a beamlet control mechanism. The beamlet control mechanism may be configured to produce a plurality of beamlets utilizing electrons provided by the electron source and deliver one of the plurality of beamlets toward a target at a time instance. The apparatus may also include an array of detectors corresponding to the plurality of beamlets. The array of detectors may be configured to produce an image of the target at least partially based on electrons backscattered out of the target.

An additional embodiment of the present disclosure is directed to an apparatus. The apparatus may include an electron source and a beamlet control mechanism. The beamlet control mechanism may be configured to produce a plurality of beamlets utilizing electrons provided by the electron source and deliver a first beamlet of the plurality of beamlets toward a target at a first time instance and a second beamlet of the plurality of beamlets toward the target at a second time instance. The apparatus may also include a detector configured to produce an image of the target at least partially based on electrons backscattered out of the target.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to multi-beam scanning electron microscope (SEM) inspection systems and methods for controlling such inspection systems in order to provide support for backscattered electrons (BSE) imaging.

Figure 1:
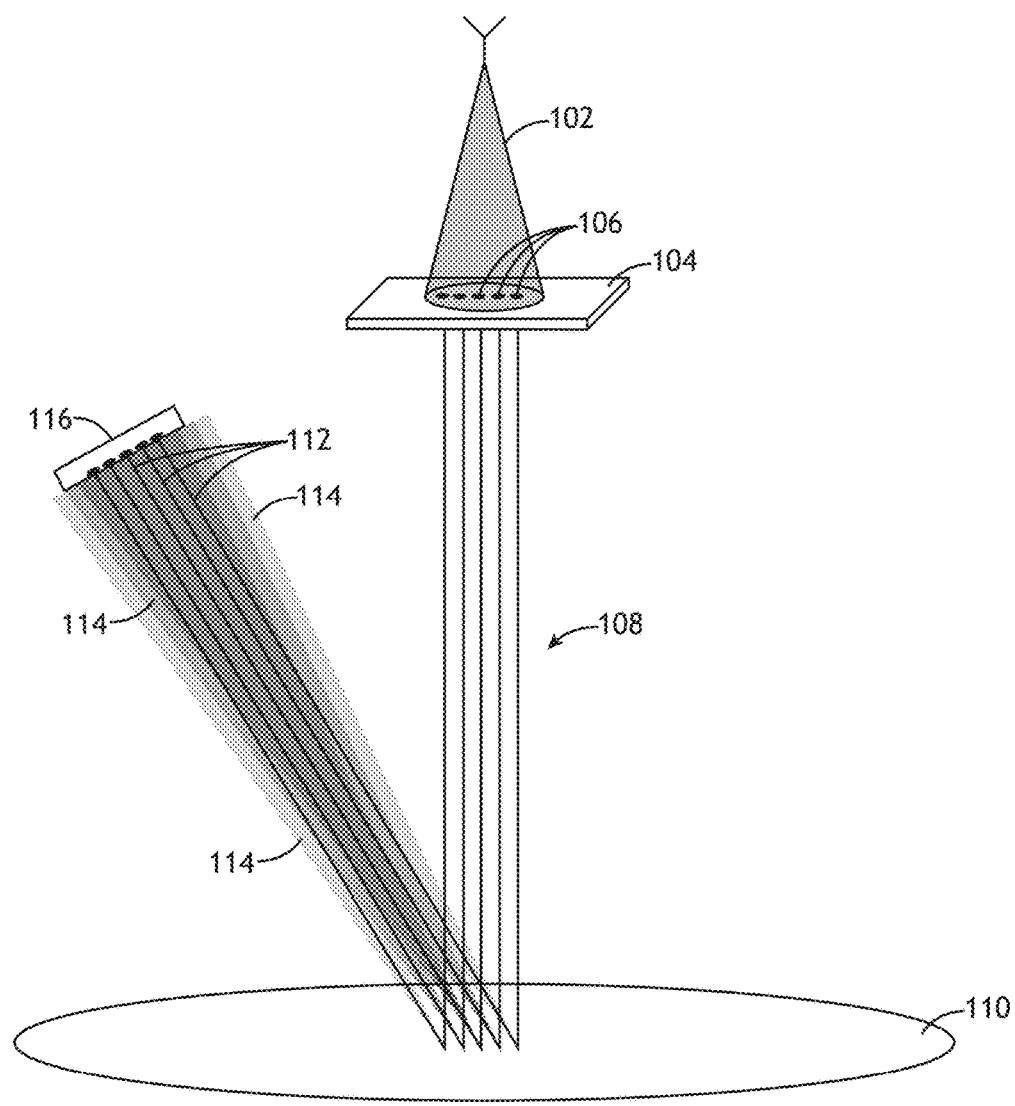
FIG. 1 is an illustration depicting a simplified multi-beam SEM inspection system.

Referring generally to FIG. 1, an illustration depicting a simplified multi-beam SEM inspection system 100 is shown. The multi-beam SEM inspection system 100 may include an electron source 102 configured to deliver electrons toward a multi-beam aperture array 104. The multi-beam aperture array 104 may define a plurality of apertures 106 (may be arranged as a one-dimensional or a two-dimensional array), which may be configured to produce a plurality of beamlets 108 utilizing the electrons provided by the electron source 102. The beamlets 108 may be delivered toward a target (e.g., a wafer) 110 to excite the atoms in the target 110, which in turn emit secondary electrons (SE) 112 and backscattered electrons (BSE) 114 that can be detected using a detector array 116.

It is noted that the beamlets 108 may need to be managed carefully so that the scanning electrons from the multitude of beamlets 108 are not mixed while in route to each of their designated/corresponding detectors in the detector array 116. However, because the BSE 114 have a much higher energy and a much larger energy spread than the SE 112, the BSE 114 may inevitably become mixed, which significantly complicates the acquisition of multi-beam BSE images.

Figure 2:
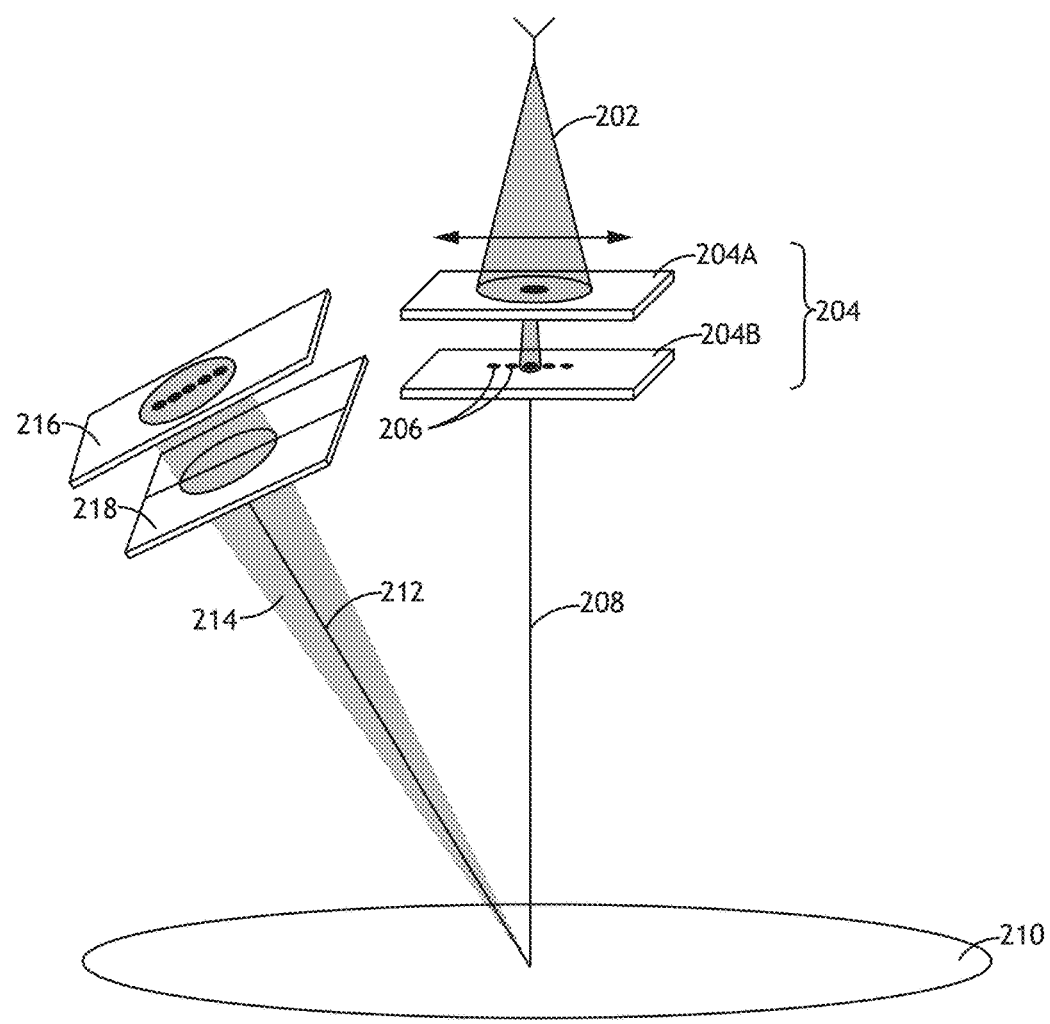
FIG. 2 is an illustration depicting a multi-beam SEM inspection system configured in accordance with an embodiment of the present disclosure.

Accordingly, multi-beam SEM inspection systems configured in accordance with the present disclosure may be equipped with beamlet control mechanisms to manage the beamlets 108 in manners that can help eliminate the mixture of the BSE 114. FIG. 2 is an illustration depicting an exemplary multi-beam SEM inspection system 200 configured in accordance with the present disclosure.

As shown in FIG. 2, the multi-beam SEM inspection system 200 may include an electron source 202 configured to deliver electrons toward a beamlet control mechanism 204. The beamlet control mechanism 204 may include a single aperture plate 204A that can be moved relative to a multi-beam aperture array 204B. The single aperture plate 204A may be selectively aligned with one of the apertures 206 defined on the multi-beam aperture array 204B so that only a single primary beamlet 208 can be formed and delivered toward the target 210 at a given time instance. This allows the detector array 216 to only receive SE 212 and BSE 214 in response to the single primary beamlet 208, effectively eliminating the BSE 114 cross-talks depicted in FIG. 1 and allowing formation of BSE images by summing signals received at the various detectors across the detector array 216 except for the detector correlated to the SE 212.

It is noted that the SE 212 may be also be blocked/rejected using an energy filter 218. The energy filter 218 may implement filtering techniques disclosed in U.S. patent application Ser. No. 13/639,491, entitled "Charged Particle Detection System and Multi-Beamlet Inspection System", which is hereby incorporated by reference in its entirety. In some embodiments, the energy filter 218 may be conditionally disengaged to allow the SE 212 to reach its designated detector in the detector array 216 for purposes such as secondary imaging, navigation, auto-focus and the like. The energy filter 218 may then be conditionally engaged to block/reject the SE 212. With the energy filter 218 engaged, the detector array 216 may selectively use a subset of (or all of) the available detectors across the entire detector array 216 for BSE image formation (e.g., selectively summing a subset of detectors in the detector array 216 to form darkfield BSE images). In some embodiments, the energy filter 218 may also be used to block all except for the highest energy BSEs from reaching the detector array 216 to help increase the topological information presented in the BSE image formed. It is contemplated that the energy filter 218 may be implemented as an array of energy filters as described in U.S. patent application Ser. No. 13/639,491, or as a single energy filter (e.g., a large area, global energy filter) that can interact with the secondary electrons from the one, predetermined primary (image) beamlet. It is also contemplated that the energy filter 218 does not need to be particularly accurate given the large energy difference between the SEs 212 and BSEs 214.

It is further contemplated that the operations of the beamlet control mechanism 204 and the energy filter 218 may be controlled using one or more processors, which may be implemented as dedicated processing units, application-specific integrated circuits (ASICs), field-programmable gate arrays (FPGAs) or various other types of processors or processing units. It is to be understood that the processor(s) may be configured to change the relative positions of the single aperture plate 204A and the multi-beam aperture array 204B so that different primary beamlets 208 can be formed and delivered toward different locations on the target 210 one at a time. It is also to be understood that the beamlet control mechanism 204 depicted in FIG. 2 is presented for illustrative purposes and is not meant to be limiting. It is contemplated that alternative beamlet control mechanisms may be implemented without departing from the spirit and the scope of the present disclosure.

Figure 3:
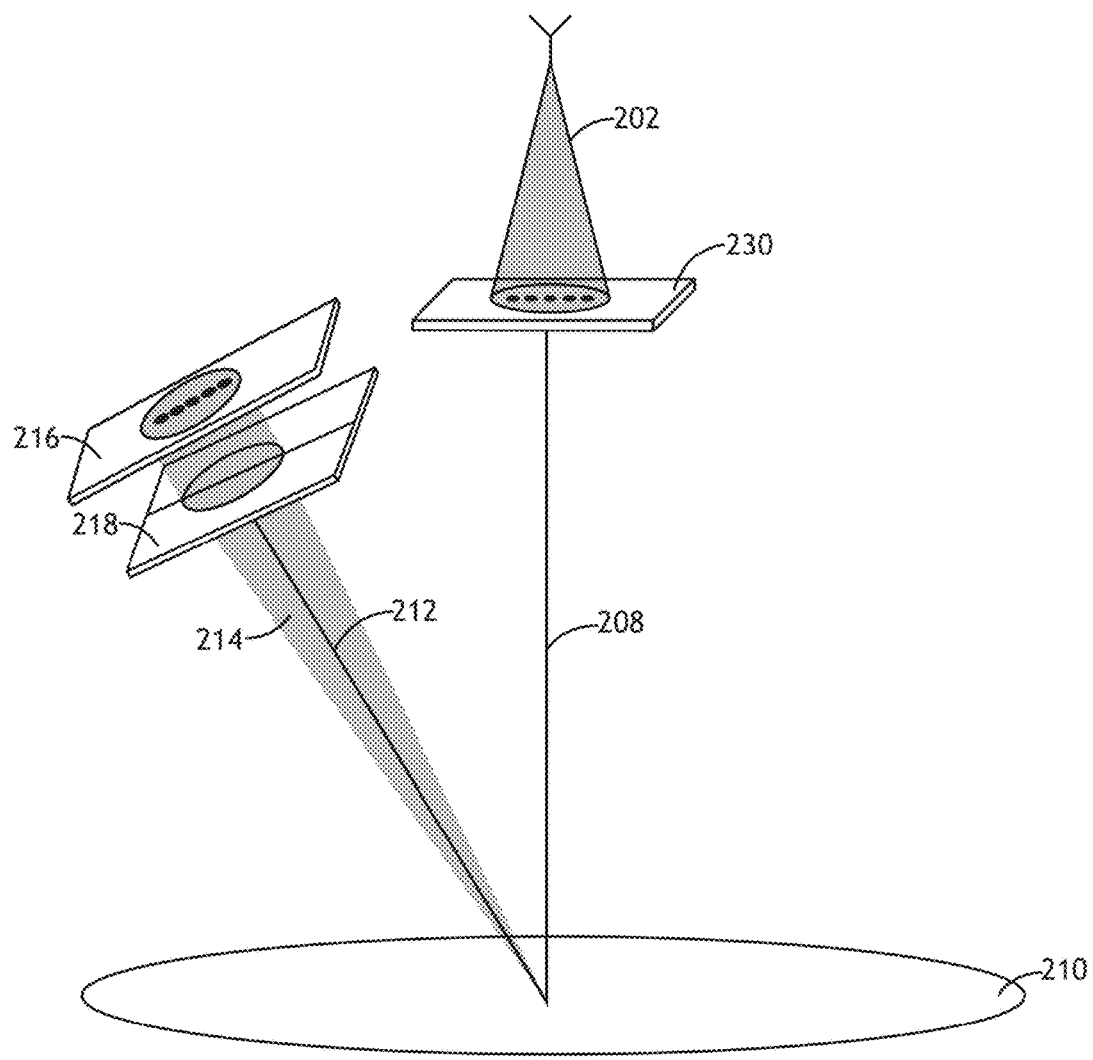
FIG. 3 is an illustration depicting another multi-beam SEM inspection system configured in accordance with an embodiment of the present disclosure.
Figure 4:
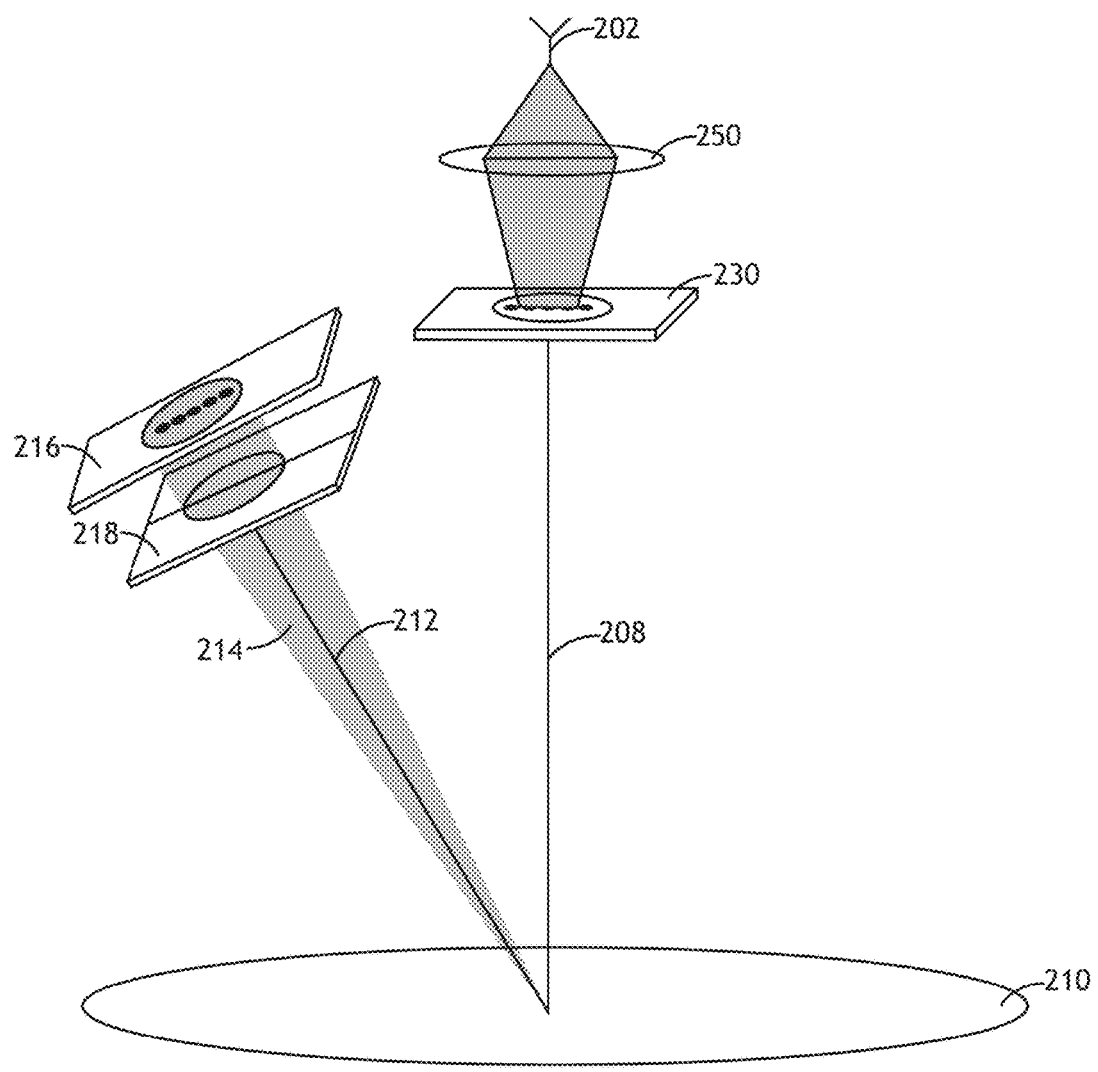
FIG. 4 is an illustration depicting another multi-beam SEM inspection system configured in accordance with an embodiment of the present disclosure.

For instance, FIG. 3 is an illustration depicting an alternative beamlet control mechanism 230 that may be utilized in some embodiments in accordance with the present disclosure. More specifically, as shown in FIG. 3, the beamlet control mechanism 230 may include a multi-beam aperture array with blanking devices (e.g., blanking electrodes) incorporated thereof. The beamlet control mechanism 230 may be configured to selectively engage/disengage the blanking devices so that all but one single beamlet 208 can be blanked off at a given time instance, effectively eliminating the BSE 114 cross-talks depicted in FIG. 1. The beamlet control mechanism 230 may be further configured to change the engagement/disengagement of the blanking devices so that different primary beamlets 208 can be formed and delivered toward different locations on the target 210 one at a time. Furthermore, as shown in FIG. 4, a lens 250 may be utilized in some embodiments to help focus the cathode beam onto the beamlet control mechanism 230 to further improve BSE image generation.

Figure 5:
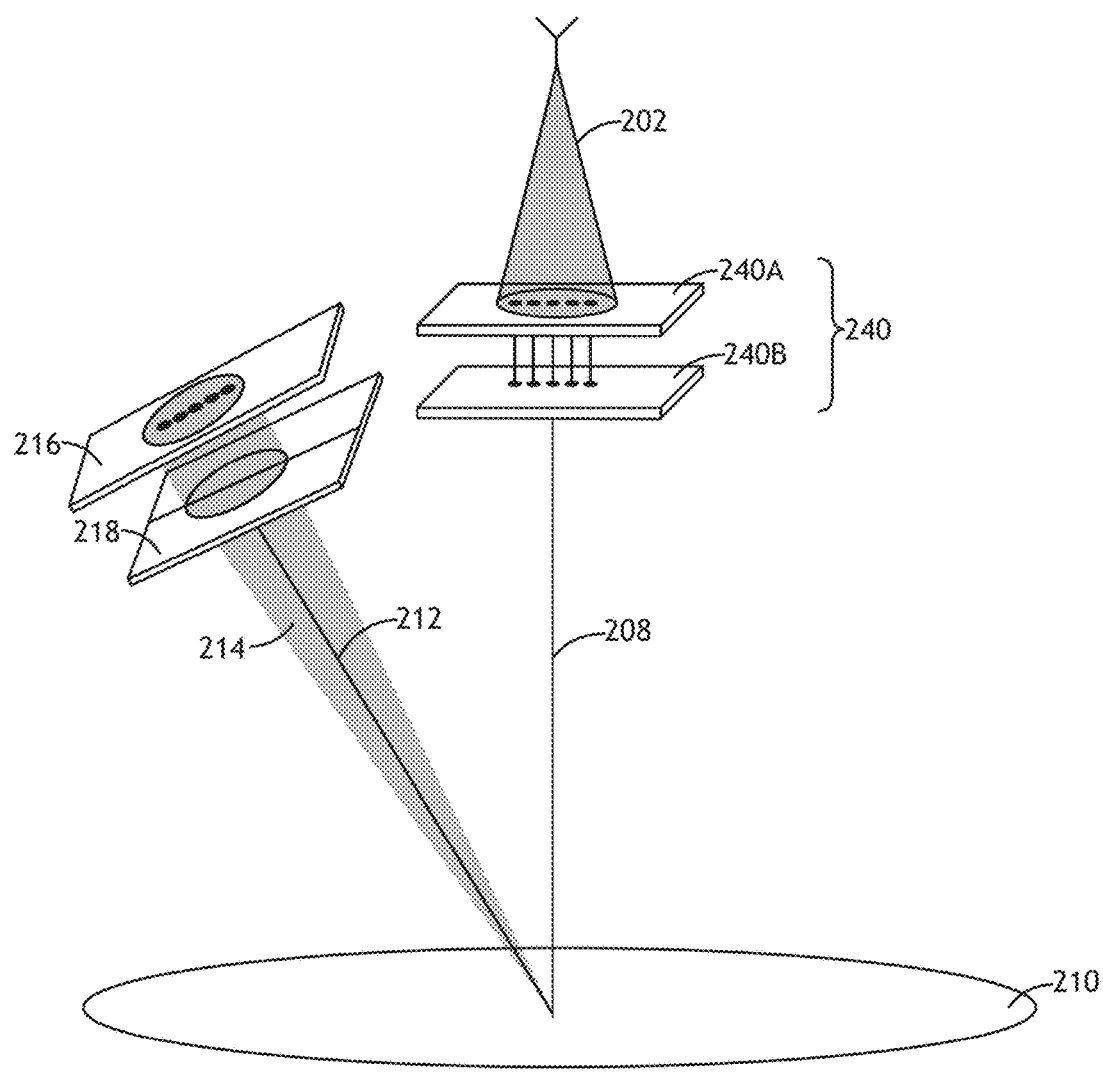
FIG. 5 is an illustration depicting another multi-beam SEM inspection system configured in accordance with an embodiment of the present disclosure.

FIG. 5 is an illustration depicting another alternative beamlet control mechanism 240. The beamlet control mechanism 240 may include a blanking array plate 240A positioned above or below a multi-beam aperture array 240B. The blanking array plate 240A may include an array of blanking devices (e.g., blanking electrodes) defined to correspond to the apertures of the multi-beam aperture array 240B. The beamlet control mechanism 240 may be configured to selectively engage/disengage the array of blanking devices provided by the blanking array plate 240A so that all but one beamlet 208 can be blanked off at a given time instance. The beamlet control mechanism 240 may also be configured to change the engagement/disengagement of the blanking devices so that different primary beamlets 208 can be formed and delivered toward the target 210 one at a time. Alternatively, it may be possible to dispense with a dedicated blanking array plate 240A and rather, apply voltage to all but one of the apertures in the aperture array 240B to form a retarding field that does not let the primary electrons through.

Figure 6:
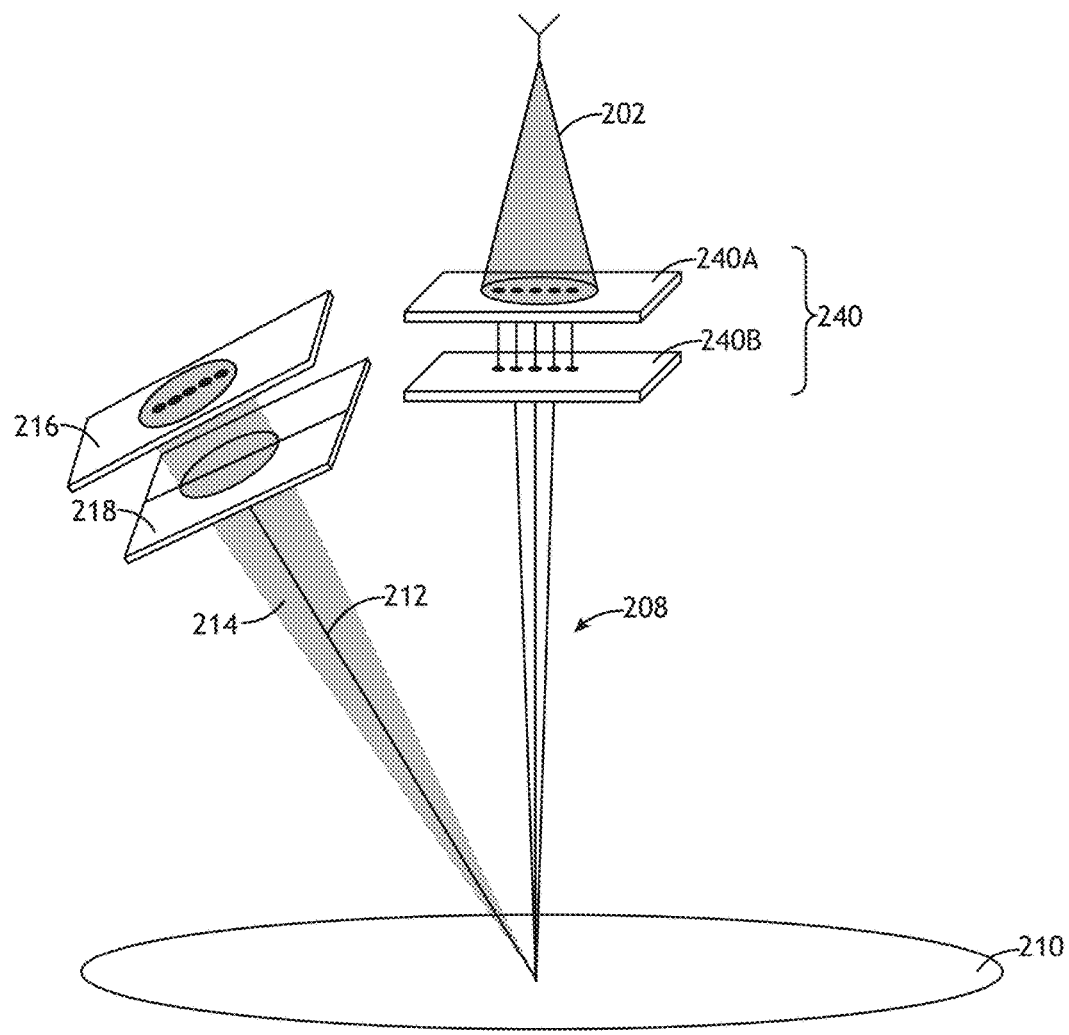
FIG. 6 is an illustration depicting another multi-beam SEM inspection system configured in accordance with an embodiment of the present disclosure.

It is contemplated that the blanking array plate 240A may also be utilized in various other manners without departing from the spirit and scope of the present disclosure. For instance, as shown in FIG. 6, the beamlet control mechanism 240 may be configured to selectively engage/disengage the array of blanking devices provided by the blanking array plate 240A so that more than one beamlets may be allowed through and one or more deflectors and/or lenses may be utilized to converge the unblanked beamlets 208 to a single point on the target 210.

As will be appreciated from the above, the beamlet control mechanisms configured in accordance with the present disclosure can effectively enable BSE imaging on multi-beam SEM inspection systems. In some embodiments, BSE images may be formed by summing signals from multiple detectors in a detector array except the detector correlated to the single unblanked beamlet. Alternatively, an energy filter may be utilized to block/reject the SE from the single unblanked beamlet, allowing BSE images to be formed by summing signals received at all detectors in the detector array.

It is to be understood that the multi-beam SEM inspection systems configured in accordance with the present disclosure may be utilized as a part of, or in conjunction with, various types of inspection/detection systems/devices described in related U.S. Patents and U.S. Patent Applications, including, but not limited to, U.S. patent application Ser. No. 14/115,326, entitled "Multi-spot Collection Optics", U.S. Pat. No. 7,504,622, entitled "High Throughput Multi Beam Detection System and Method", U.S. Pat. No. 7,244,949, entitled "Particle-optical systems and arrangements and particle-optical components for such systems and arrangements", U.S. Pat. No. 7,554,094, entitled "Particle-optical systems and arrangements and particle-optical components for such systems and arrangements", U.S. Pat. No. 8,097,847, entitled "Particle-optical systems and arrangements and particle-optical components for such systems and arrangements", U.S. Pat. No. 8,637,834, entitled "Particle-optical systems and arrangements and particle-optical components for such systems and arrangements", U.S. patent application Ser. No. 14/165,573, entitled "Particle-Optical Systems and Arrangements and Particle-Optical Components for such Systems and Arrangements", U.S. Pat. No. 8,039,813, entitled "Charged particle-optical systems, methods and components", U.S. patent application Ser. No. 11/991,546, entitled "Particle-Optical Component", U.S. patent application Ser. No. 11/991,547, entitled "Charged Particle Inspection Method and Charged Particle System", U.S. patent application Ser. No. 14/309,452, entitled "Charged particle inspection method and charged particle system", U.S. patent application Ser. No. 13/825,820, entitled "Particle-Optical Systems and Arrangements and Particle-Optical Components for such Systems and Arrangements", U.S. patent application Ser. No. 14/437,738, entitled "Apparatus and method for inspecting a surface of a sample", U.S. patent application Ser. No. 14/408,137, entitled "Apparatus and method for inspecting a surface of a sample", and U.S. patent application Ser. No. 15/079,046, entitled "Method and System for Charged Particle Microscopy with Improved Image Beam Stabilization and Interrogation", which are hereby incorporated by reference in their entireties.

It is to be understood that while the examples above referred to a wafer as the subject of inspection, the inspection systems configured in accordance with the present disclosure are not limited to inspecting wafers. The inspection systems configured in accordance with the present disclosure are applicable to other types of subjects as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An apparatus, comprising:
an electron source;
a beamlet control mechanism configured to produce a plurality of beamlets utilizing electrons provided by the electron source, the beamlet control mechanism further configured to deliver one of the plurality of beamlets toward a target at a time-instance, wherein the beamlet control mechanism comprises at least one of an aperture plate, an aperture array, or one or more blanking devices; and
a detector configured to produce an image of the target at least partially based on electrons backscattered out of the target, wherein the detector is further configured to receive electrons backscattered out of the target for two or more beamlets delivered toward the target at two or more time-instances, wherein the detector is further configured to produce the image of the target at least partially based on a sum of the received backscattered electrons.

2. The apparatus of claim 1, wherein the beamlet control mechanism comprises a single aperture plate movable relative to a multi-beam aperture array, wherein an alignment of the single aperture plate and one of an array of apertures defined on the multi-beam aperture array is utilized to deliver one of the plurality of beamlets toward the target.

3. The apparatus of claim 1, wherein the beamlet control mechanism comprises an array of blanking devices defined to correspond to an array of apertures defined on a multi-beam aperture array, wherein selective engagement and disengagement of the array of blanking devices is utilized to deliver one of the plurality of beamlets toward the target.

4. The apparatus of claim 1, wherein the beamlet control mechanism comprises a multi-beam aperture array with a blanking device incorporated within each aperture defined on the multi-beam aperture array.

5. The apparatus of claim 1, wherein the image of the target includes a backscattered electrons (BSE) image of the target.

6. The apparatus of claim 1, further comprising:
an energy filter configured to selectively block the detector from receiving secondary electrons generated when one of the plurality of beamlets is delivered to the target.

7. The apparatus of claim 6, wherein the energy filter is configured to block all except for the highest energy backscattered electrons from reaching the detector.

8. The apparatus of claim 6, wherein the energy filter includes an energy filter array.

9. The apparatus of claim 6, wherein the energy filter includes a large area global energy filter.

10. The apparatus of claim 1, wherein the detector includes an array of detectors corresponding to the plurality of beamlets.

11. The apparatus of claim 1, further comprising:
at least one lens positioned between the electron source and the beamlet control mechanism, the at least one lens configured to focus the electrons provided by the electron source onto the beamlet control mechanism.

12. The apparatus of claim 1, further comprising:
at least one deflector or lens configured to converge one or more of the plurality of beamlets to a single point on the target.

13. An apparatus, comprising:
an electron source;
a beamlet control mechanism configured to produce a plurality of beamlets utilizing electrons provided by the electron source, the beamlet control mechanism further configured to deliver one of the plurality of beamlets toward a target at a time instance; and an array of detectors corresponding to the plurality of beamlets, the array of detectors configured to produce an image of the target at least partially based on electrons backscattered out of the target, wherein the array of detectors is further configured to receive electrons backscattered out of the target for two or more beamlets delivered toward the target at two or more time-instances, wherein the detector is further configured to produce the image of the target at least partially based on a sum of the received backscattered electrons.

14. The apparatus of claim 13, wherein the beamlet control mechanism comprises a single aperture plate movable relative to a multi-beam aperture array, wherein an alignment of the single aperture plate and one of an array of apertures defined on the multi-beam aperture array is utilized to deliver one of the plurality of beamlets toward the target.

15. The apparatus of claim 13, wherein the beamlet control mechanism comprises an array of blanking devices defined to correspond to an array of apertures defined on a multi-beam aperture array, wherein selective engagement and disengagement of the array of blanking devices is utilized to deliver one of the plurality of beamlets toward the target.

16. The apparatus of claim 13, wherein the beamlet control mechanism comprises a multi-beam aperture array with a blanking device incorporated within each aperture defined on the multi-beam aperture array.

17. The apparatus of claim 13, wherein the image of the target includes a backscattered electrons (BSE) image of the target.

18. The apparatus of claim 13, further comprising:

an energy filter configured to selectively block the array of detectors from receiving secondary electrons generated when one of the plurality of beamlets is delivered to the target.

19. An apparatus, comprising:

an electron source;

a beamlet control mechanism configured to produce a plurality of beamlets utilizing electrons provided by the electron source, the beamlet control mechanism further configured to deliver a first beamlet of the plurality of beamlets toward a target at a first time instance and a second beamlet of the plurality of beamlets toward the target at a second time instance; and a detector configured to produce an image of the target at least partially based on electrons backscattered out of the target, wherein the detector is further configured to receive electrons backscattered out of the target for two or more beamlets delivered toward the target at the first and second time instances, wherein the detector is further configured to produce the image of the target at least partially based on a sum of the received backscattered electrons.

20. The apparatus of claim 19, wherein the beamlet control mechanism comprises a single aperture plate movable relative to a multi-beam aperture array, wherein an alignment of the single aperture plate and one of an array of apertures defined on the multi-beam aperture array is utilized to deliver one of the plurality of beamlets toward the target.

21. The apparatus of claim 19, wherein the beamlet control mechanism comprises an array of blanking devices defined to correspond to an array of apertures defined on a multi-beam aperture array, wherein selective engagement and disengagement of the array of blanking devices is utilized to deliver one of the plurality of beamlets toward the target.

22. The apparatus of claim 19, wherein the beamlet control mechanism comprises a multi-beam aperture array with a blanking device incorporated within each aperture defined on the multi-beam aperture array.

* * * * *